United States Patent [19]

Cathey, Jr. et al.

[11] Patent Number: 5,194,344

[45] Date of Patent: Mar. 16, 1993

[54] METHOD OF FABRICATING PHASE SHIFT RETICLES INCLUDING CHEMICALLY MECHANICALLY PLANARIZING

[75] Inventors: David A. Cathey, Jr.; J. Brett Rolfson, both of Boise, Id.

[73] Assignee: Micron Technology, Inc., Boise, Id.

[21] Appl. No.: 675,405

[22] Filed: Mar. 26, 1991

[51] Int. Cl.$^5$ .............................................. G03F 9/00
[52] U.S. Cl. ........................................ 430/5; 430/22; 430/269; 430/311; 430/396
[58] Field of Search ..................... 430/5, 22, 269, 311, 430/396; 428/156

[56] References Cited

U.S. PATENT DOCUMENTS

| | | | |
|---|---|---|---|
| 3,604,778 | 9/1971 | Burckhardt | 350/3.5 |
| 4,360,586 | 11/1982 | Flanders et al. | 430/321 |
| 4,755,415 | 7/1988 | Iijima et al. | 428/156 |
| 4,902,899 | 2/1990 | Lin et al. | 250/492.1 |

OTHER PUBLICATIONS

Durnin, J., "Diffraction-Free Beams" Apr. 13, 1987, Physical Review Letters, p. 1499.
Amanaka, et al, "A 5.9ym² Syser low power SRAM cell" IEDM 90-477, 1990.
Watanabe, "Transparent Phase Shifting Mask" IEDM 90-821, 1990.
Terasawa, "0.3 micron optical lithography," SPIE vol. 1088, Optical/Laser Microlithography 11 (1989).
Nitayama, "New Phase Shifting Mask", IEDM 89-57, IDEM 89-57 1989.
K. Nakagawa, "Fabrication of 64M DRAM" IEDM 90-817, 1990.
Levenson, "The Phase Shifting Mask 11", IEEE Transactions on Electron Devices, vol. ED-31 NO.6, Jun. 1984.
Lin, "Phase Shifting and Other Challenges", IBM—EF-15 Sep. 26, 1990.
Hanzu, "New Phase Shifting Mask" SPIE vol. 1264 Optical/Laser Microlithography 111, 1990.
Pfau, "Exploration of Fabrication Techniques for Phase Shifting Masks," Semiconductor Research Corporation, Sep. 11, 1990.
Neureuther, "Modeling Phase Shifting Masks" BACUS Symposium Paper, Sep. 26, 1990.
Fukuda, "Phase Shifting Mask and Flex Method for Advanced Photolithography", SPIE vol. 1264 (1990).
"LSI Process Lithography, Reticle Stepper DRAM", Jul. Issue of Microdevice (1990).
"64M", N114EI Microdevices, p. 103, (1990).
Ku, et al, "Use of a Phase Shifting X-Ray Mask", Semiconductor Research Corporation, Jun. 23, 1987.
Nakagawa, et al., "Fabrication of 64M DRAM with i-line Phase Shift Lithography".
Levenson, et al., "What is a Phase-Shifting Mask", IBM Research Report Aug. 15, 1990..
Proutz, et al., "Optical Imaging with Phase Shift Masks" Technology Transfer, #9008032A-MIN.
"Second Phase Shift Mask Workshop Technology" Transfer #90100345A-MIN.
Levenson, et al., "Improving Resolution in Photolithography with a Phase Shift Mask", IEEE Transactions in Electron Devices, vol. ED-29 No. 12, Dec., 1982.

Primary Examiner—Marion E. McCamish
Assistant Examiner—S. Rosasco
Attorney, Agent, or Firm—Stephen A. Gratton

[57] ABSTRACT

A method of fabricating phase shifting reticles that can be used as a mask in photolithographic processes such as semiconductor wafer patterning. An opaque film such as chromium is first deposited on a transparent substrate. The opaque film is then patterned with openings by a first photolithographic step. A phase shifter material such as (SiO$_2$) is then deposited into the openings to form phase shifter sections. The phase shifter sections are then polished by chemical mechanical planarization (CMP) to a thickness "T" which is selected to produce a 180° phase shift. A pattern of light apertures is then formed by a second photolithographic process in the opaque film such that a reticle having a repetitive phase shifting pattern is formed.

18 Claims, 2 Drawing Sheets

METHOD OF FABRICATING PHASE SHIFT RETICLES INCLUDING CHEMICALLY MECHANICALLY PLANARIZING

FIELD OF THE INVENTION

This invention relates to semiconductor manufacture and more particularly to a novel process particularly suited to fabricating phase shifting reticles that can be used in fineline photolithography.

BACKGROUND OF THE INVENTION

As semiconductor manufacturing advances to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

The requirement of small feature sizes with close spacing between adjacent features requires high resolution photolithographic processes. In general, photolithography utilizes a beam of light, such as U.V. waves, to transfer a pattern from a photolithographic mask onto a photoresist coating through an imaging lens. The mask includes opaque and transparent regions such that the shapes match those of the openings in the resist coating in the desired or predetermined pattern.

One technique currently being investigated for improving the resolution of the photolithographic process is known as phase shift lithography. With phase shift lithography the interference of light rays is used to overcome diffraction and improve the resolution and depth of optical images projected onto a target. In phase shift lithography, the phase of an exposure light at the object is controlled such that adjacent bright areas are formed preferably 180° out of phase with one another. Dark regions are thus produced between the bright areas by destructive interference even when diffraction would otherwise cause these areas to be lit. This technique improves total resolution at the object and allows resolutions as fine as 0.25 μm to occur.

An early patent in this field, U.S. Pat. No. 4,360,586 to Flanders et al, was issued on Nov. 23, 1982 and assigned to MIT. This patent was directed to exposing periodic optical features on an object surface. The features were characterized by a spatial period p. According to the invention, a source of radiant energy of wavelength λ illuminates a surface to be exposed through a mask having a spatial period separated from the surface by a distance approximately $Sn = p^2/n\lambda$, where n is an integer greater than one.

With respect to semiconductor fabrication numerous laboratory techniques have been proposed to employ phase shifting in the photopatterning of semiconductor wafers Most of the work in this area has centered around either "Alternating Phase Shifting", "Subresolution Phase Shifting", or "Rim Phase Shifting" experiments. In general, in each of these techniques a phase shift mask or reticle is constructed in repetitive patterns of three distinct layers of material. An opaque layer on the mask provides areas that allow no light transmission therethrough, a transparent layer provides areas which allow close to 100% of light to pass through and a phase shifter layer provides areas which allow close to 100% of light to pass through but phase shifted 180° from the light passing through the transparent areas. The transparent areas and phase shifting areas are situated such that light rays diffracted through each area is canceled out in a darkened area therebetween. This creates the pattern of dark and bright areas which can be used to clearly delineate features of a pattern on a photopatterned wafer.

"Alternating Phase Shifting" as disclosed in [1] is a spatial frequency reduction concept similar to the method disclosed in the Flanders et al patent. It is characterized by a pattern of features alternately covered by a phase shifting layer. "Subresolution Phase Shifting" [2] promotes edge intensity cut off by placing a subresolution feature adjacent to a primary image and covering it with a phase shifting layer. "Rim Phase Shifting" [3] overhangs a phase shifter over a chrome mask pattern.

In general, these phase shifting techniques have not been adapted to large scale semiconductor manufacturing processes. One problem with applying phase shifting lithography into practical use, in manufacturing semiconductors, is the difficulty in reticle mask making, inspection, and repair. The process must be compatible with manufacturing conditions, (i.e. inexpensive, repetitive, clean) and prior art laboratory techniques have not heretofore met these criteria.

A representative state of the art semiconductor laboratory process for making a phase shift mask or reticle is disclosed in reference [4]. This process was also generally disclosed in the Flanders et al patent. This process is shown in FIGS. 1A–1C and is termed a "lift off process".

The "lift off process" may be used to fabricate a reticle on hard copy of an individual drawing for a semiconductor circuit layout. The reticle may then be used directly as a mask in the photopatterning process or may be used to produce a photomask. As an example, this reticle may be used to pattern a wafer surface in a stepped pattern transfer. DRAM's and SRAM's because of their repetitive nature are adapted to manufacture in this manner.

Referring to FIG. 1A, with the "lift off process" a transparent quartz substrate 10 has a film of an opaque light blocking material such as chromium (CR) patterned thereon. The chromium (CR) may be deposited and patterned onto the substrate 10 by a conventional process such as electron beam deposition and photolithography. In the example of FIG. 1A, the pattern is a periodic arrangement of lines 12 of (CR) and spaces 14 patterned to the quartz substrate 10.

A layer of resist 16 is then deposited and patterned over the patterned chromium (CR) lines 12 and spaces 14. Every other space 14 is covered with resist 16 such that an alternating pattern of phase shifters and openings will be ultimately formed. As shown in FIG. 1B the resist 16 is deposited in an overhanging profile such that a subsequent etching process aids the "lift off" step.

With reference to FIG. 1B, after deposition of the resist 16, a film of phase shifter material 18 such as ($SiO_2$) is blanket deposited over the photoresist 16 and patterned openings 14. The phase shift ultimately obtained is a function of the thickness and refractive index of this phase shifter material 16, which are preferably selected to provide a 180° phase shift.

As shown in FIG. 1(C) the phase shifter film layer 18 ($SiO_2$) is then "lifted off" the layer of photoresist 16 by etching away the photoresist 16. This leaves a phase shifter 18 in every other opening 14 between the chromium (CR) light blockers 12. This provides an alternating phase shifting pattern as previously explained.

A problem with this "lift off process" is that it is a messy procedure not suitable for large scale manufacturing. Large chunks of (SiO₂) material are lifted by the etching process and are difficult to remove from the finished reticle. These contaminants may cause subsequent contamination of the finished wafer. Additionally with this "lift off process" the surface of the chromium (CR) light blockers 12 and of the phase shifters 18 may be rough and optically irregular.

The process of the present invention is directed to a process for providing a clean, repetitive, technique for forming accurate phase shifting reticles suitable for large scale semiconductor manufacturing. Moreover the process of the invention polishes the phase shifters and light blockers to provide phase shifters with a smooth and optically flawless surface.

SUMMARY OF THE INVENTION

In accordance with the present invention a novel method of fabricating phase shift reticles for semiconductor photolithography is provided. The method, in general, includes the steps of:

depositing an opaque film on a transparent substrate to a predetermined thickness;

forming a first pattern of openings through the opaque film to the substrate by a first photolithographic process;

depositing a phase shifter material upon the opaque film and into the openings;

polishing the phase shifter material to the endpoint of the opaque film and to a thickness "T" selected to achieve a 180° phase shift; and forming a second pattern of openings through the opaque film to form light apertures with light blocker sections on either side in a repetitive pattern of light blocker sections, phase shifter sections, light blocker sections, and light apertures.

In use as a reticle, during photopatterning of a wafer, incident light is directed through the quartz substrate. Light passing through a phase shifter section is diffracted in an opposite (180°) optical phase from light passing through an adjacent light aperture. This phase canceling produces a dark region formed on the target object (wafer) between the adjacent light aperture and phase shifter to increase the contrast and depth of the projected image.

Numerous other features, objects, and advantages of the invention will become apparent from the following specification when read in connection with the accompanying drawing.

DETAILED DESCRIPTION OF PREFERRED EMBODIMENTS

Referring now to FIGS. 2A-2H a method of fabricating a phase shift reticle in accordance with the invention is shown.

Figure 1A:
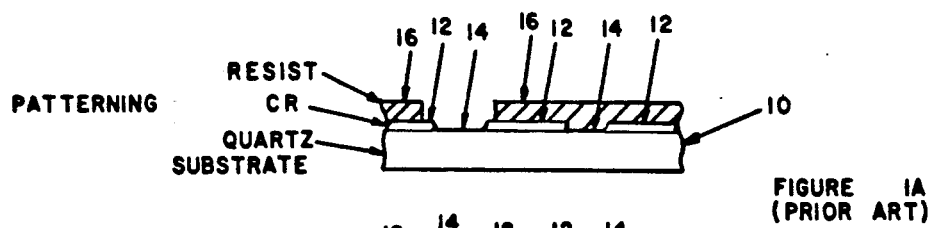
FIGS. 1A-1C are diagrammatic representations of the steps involved in a prior art "lift off" process for forming a phase shift reticle.
Figure 1B:
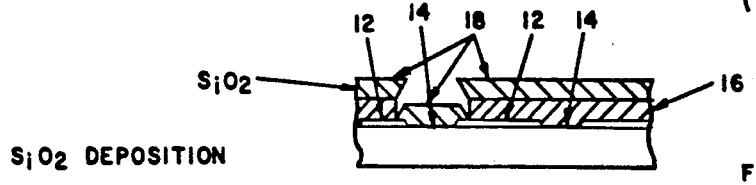
Figure 1C:
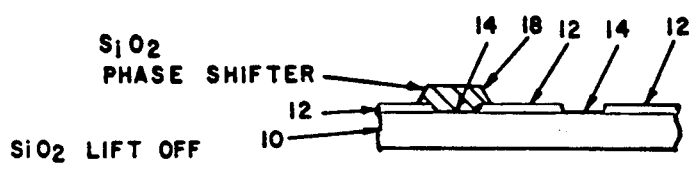
Figure 2A:
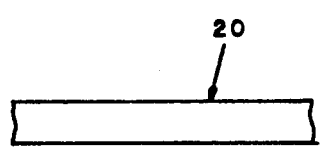
FIGS. 2A-2H are diagrammatic representations of the steps involved in fabricating a phase shift reticle in accordance with the invention.
Figure 2B:
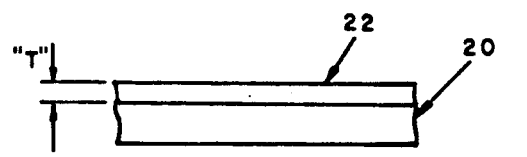
Figure 2C:
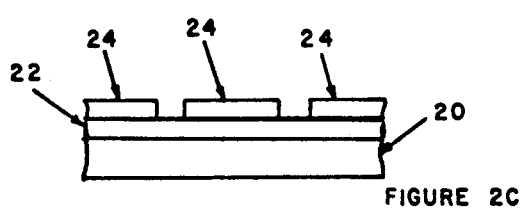
Figure 2D:
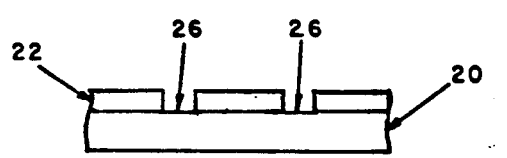
Figure 2E:
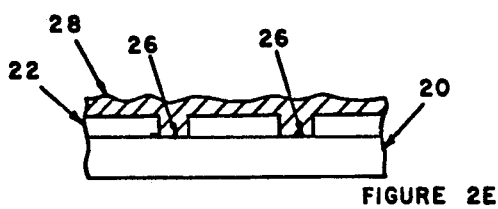
Figure 2F:
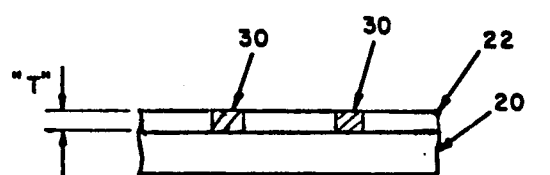
Figure 2G:
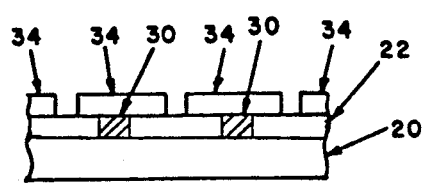
Figure 2H:
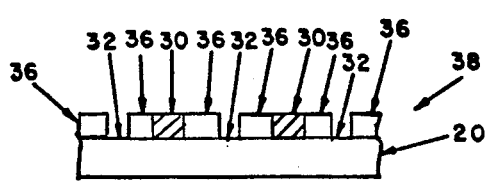

The method of the invention includes the steps of:

depositing an opaque film on a transparent substrate to a thickness "T", (FIGS. 2A,2B);

forming a pattern of first openings through the opaque film to the substrate, by a first photolithographic process, (FIGS. 2C,2D);

depositing a phase shifter material over the opaque film and into the openings, (FIG. 2E);

polishing the phase shifter material to the endpoint of the opaque film and to a thickness "T" to form phase shifter sections, that produce a 180° phase shift, (FIG. 2F);

forming a pattern of second openings through the opaque film to the substrate as light apertures having light blocker sections on either side, (FIG. 2H).

This process forms a reticle having a repetitive pattern of light blocker section, phase shifter section, light blocker section and light aperture. This reticle may then be used in photopatterning a semiconductor wafer.

Referring now to FIG. 2A, a phase shift reticle fabricated in accordance with the invention is formed on a transparent substrate 20. In an illustrative embodiment of the invention the transparent substrate 20 is quartz (QZ). Quartz is a highly purified glass favored for its optical properties, inherent stability at high temperatures and its cleanliness. Quartz is typically utilized as the mask substrate material in optical projection systems and is highly transparent in the deep UV region. Alternately, the substrate 20 may be formed of any other transparent material having suitable optical and mechanical properties.

Next, and as shown in FIG. 2B, an opaque film 22 is deposited upon the quartz substrate 20. The opaque film 22 is deposited to a predetermined thickness "T" which, as will hereinafter be explained, helps to determine the 180° phase shift produced by phase shifters subsequently formed on the quartz substrate 20.

The opaque film 22 may be deposited onto the substrate 20 by conventional processes such as sputtering; chemical-vapor deposition (CVD), or electron beam deposition (EBD). In the illustrative embodiment, the opaque film 22 material is chromium (CR), which is typically utilized in such applications. Chromium (CR) is characterized by mechanical properties suitable for plating and is more than 90% opaque to wavelengths in the UV and deep UV region. Other opaque films however, such as iron oxide and aluminum would also be suitable for the application.

Next and as shown in FIG. 2C, a photosensitive layer of photo resist 24 is coated and patterned onto the opaque film 22 by techniques known in the art, such as an E-beam writing or laser pattern writing. An etch and strip step may then be used to form a first pattern of openings 26 through the opaque film 22 to the substrate 20, (FIG. 2D).

Next and as shown in FIG. 2E a phase shifter material 28 is blanket deposited over the opaque film 22 and into the openings 26. The phase shifter material 28 may be deposited by any conventional process such as evaporation, or chemical vapor deposition CVD. The phase shifter material 28 may be any transparent material that has an index of refraction with light that is different than the index of refraction for light with air. It is also preferable to utilize an inorganic material that is transparent in the UV and deep UV regions where most photolithographic processes are performed. This may, for example, be at a wavelength of about 248 nm for KrF excimer laser lithography. Photolithography may also be performed in the range of the UV i-line (365 nm) or the UV g-line (436 nm) which are also common wavelengths used in photolithographic processes.

A suitable phase shifter material 28 is ($SiO_2$) which is commonly used as the mask substrate material in semiconductor optical projection systems. Another suitable phase shifter material is silicon nitride ($SiN_x$). Other phase shifter materials would also be suitable in this application.

In the finished reticle the phase shifter material 28 preferably has a thickness "T" (FIG. 2F) that produces a 180° phase shift for light passing therethrough. This optimal thickness can be determined by the formula $$T = \frac{i\lambda}{2(n-1)}$$

where
T = thickness of phase shift material
i = an odd integer
$\lambda$ = wavelength of exposure light
n = refractive index of phase shifter material at the exposure wavelength As an example, at an exposure wavelength of 365 nm (i-line), ($SiO_2$) has a refractive index of 1.48. This implies one optimal thickness "T" for achieving a 180° phase shift of t=3800Å.

One method of achieving the proper thickness "T" of the phase shifter material is by initially depositing opaque material 22 (FIG. 2B) onto the substrate 20 to the thickness "T". The phase shifter material 28 which is initially blanket deposited without regard to thickness (FIG. 2E), can then be polished to the planar endpoint of the opaque material 22 and to the thickness "T" (FIG. 2F). Alternately the opaque film 22 may also be deposited to a thickness greater than the thickness "T" and both the phase shifter material 28 and the opaque film 22 can be polished to the desired thickness "T".

As shown in FIG. 2F this forms a pattern of phase shifter sections 30 in the openings 26 previously formed in the opaque film 22. Each phase shifter section 30 is bounded by opaque film 22 on either side and each phase shifter section 30 is polished to the exact thickness "T". Additionally each phase shifter section 30, as well are the surface of the opaque film 22, is planarized and polished to help provide consistent optical properties.

Polishing of phase shifter material to the exact thickness "T" can be accomplished by chemical-mechanical polishing techniques which are known in the art. One such technique is known as chemical mechanical planarization (CMP). In general, chemical mechanical planarization involves holding or rotating a wafer of semiconductor material against a wetted polishing surface under controlled chemical, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. The procedure also removes surface imperfections and roughness to produce a more optically perfect surface suitable for the present application.

Such apparatus for polishing semiconductor wafers are disclosed in U.S. Pat. Nos. 4,193,226 and 4,811,522. Another such apparatus is manufactured by Westech Engineering and is designated as a Model 372 Polisher.

Next and as shown in FIG. 2G a second photolithographic process (photopattern, etch and strip resist) is used to form a second pattern of openings through the opaque film 22 to the substrate 20. These openings function as light apertures 32 (FIG. 2H). To produce these light apertures 32, a patterned resist 34 is applied to the opaque film 22, (FIG. 2G) followed by an etch and strip step to form the light apertures 32. Each light aperture is bounded on either side by a light blocker section 36 of opaque film 22.

As shown in FIG. 2H this forms a repetitive pattern comprising a light blocker section 36, a light aperture 32, a light blocker section 36, and a phase shifter section 30. The width of the light blocker sections 36, phase shifter sections 30, and light apertures 32 may be selected as required. In the illustrative embodiment these sections each have equal widths but this is not essential to the practice of the invention.

Figure 3:
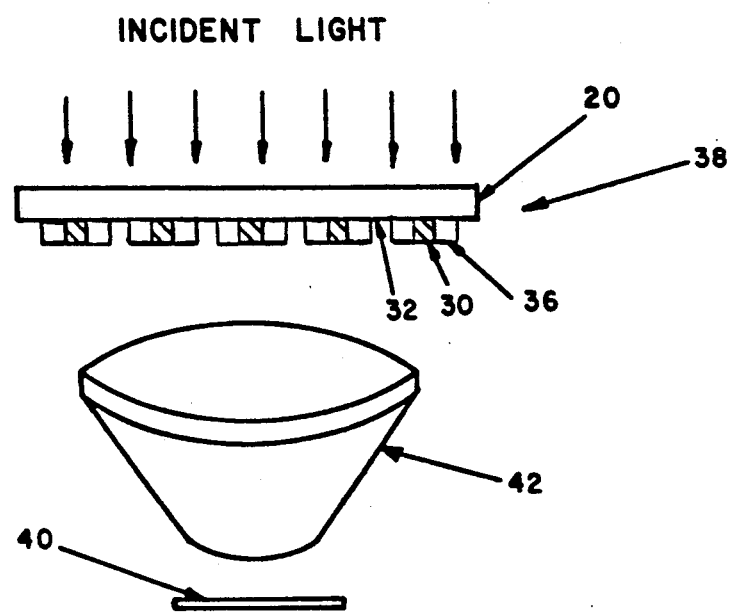
FIG. 3 is a diagrammatic representation of a phase shift reticle fabricated in accordance with the invention in use during phase shift photolithography of a semiconductor wafer.

Referring now to FIG. 3 a phase shift reticle 38 formed by the method of the invention is shown in use in a photolithographic process for photopatterning a semiconductor wafer 40. The phase shift reticle 38 is situated between the incoming incident light (i.e. KrF laser) and a wafer 40 to be processed. A reduction lens 42 is located between the phase shift reticle 38 and wafer 40. In the illustrative embodiment the reduction lens 42 is a 5x reduction system. Alternately other reduction systems such as 10X, 4X, or 1X may be utilized.

In the illustration of FIG. 3 a step and repeat system is utilized. In this system the wafer 40 is stepped under the lens 42 to expose the pattern in sections over the entire surface of the wafer 40. This is a typical application for a reticle 38 formed in accordance with the invention although other applications may also be possible including photopatterning of items other than semiconductor wafers.

Figure 4:
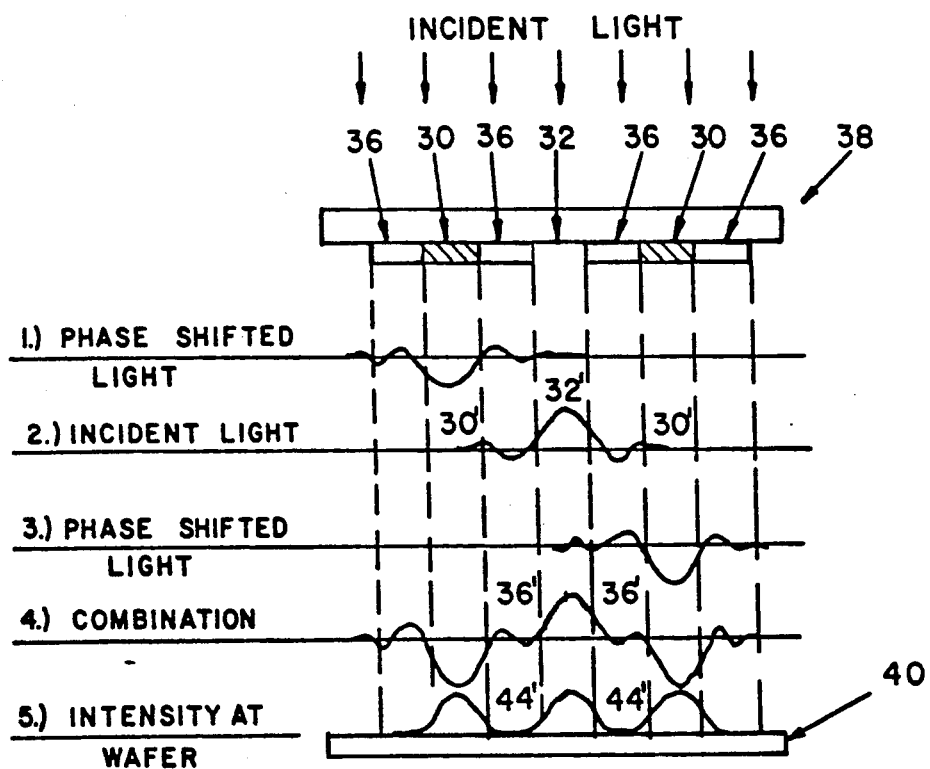
FIG. 4 is a diagrammatic representation showing the composition of light waves diffracted from phase shifters and from an adjacent light aperture on a reticle fabricated in accordance with the invention and the resulting amplitude and intensity of light waves at a target wafer.

Referring now to FIG. 4 an analysis of the composition of light waves diffracted from a light aperture 32 and adjacent phase shifter sections 30 on either side of the light aperture 32 is shown. Graph 1 denotes the amplitude and phase of phase shifted light (180°) passed through a first phase shifter 30 onto area 30' on the target wafer 40. Graph 2 denotes the amplitude and phase of incident light (no phase shift) passing through the light aperture 32' onto area 32' on the target wafer 40. Graph 3 denotes the amplitude and phase of phase shifted light (180°) passed through the phase shifter 30 on the other side of the light aperture 32. Graph 4 denotes the combined amplitude of the three light rays as seen at the object wafer 40. Graph 5 denotes the intensity of the light at the object wafer 40.

As seen in graphs 1,2, and 3 a light wave diffracted from either a phase shifting section 30, or a light aperture 32 of the reticle is naturally diffracted into areas 36' therebetween on the target wafer 40 in an area aligned with the light blocker sections 36 on the reticle 38. As shown in graph 4, the combination of the three separate diffracted rays (graphs 1,2,3) in the areas 36' substantially cancel each other out so that these areas 36' are dark with clear cut boundaries. As shown in graph 5 this produces areas of approximately zero light intensity or dark areas 44' on the wafer 40. These dark areas 40' occur where diffracted light from the light aperture 32 would otherwise light the area. The resolution and depth of the feature is thus improved by the clearly delineated dark and light areas.

Thus the invention provides a simple yet unobvious method of fabricating phase shift reticles adapted for use in semiconductor photolithographic processes. While the process of the invention has been described with reference to a preferred embodiment thereof, as will be apparent to those skilled in the art, certain changes and modifications can be made without departing from the scope of the invention as defined by the following claims.

REFERENCES

[1] M. D. Levenson, D. S. Goodman, S. Lindsey, P. W. Barjer and H. A. E. Santini, "The Phase-Shifting Mask II: Imaging Simulations and Submicrometer Resist Exposures" IEEE Transactions on Electronic Devices, Vol. ED-31, No. 6, June 1984.

[2] T. Yamanaka, N. Hasegawa, T. Tanaka, K. Ishibashi, T. Hashimoto, A. Shimizu, N. Hashimoto, K. Sasaki, T. Nishida, and E. Takeda, "A 5.9 $\mu m^2$ Super Low Power SRAM Cell Using A New Phase Shift Lithography" IEDM Tech. Dig. pp. 477-480, 1990.

[3] A. Nitayama, T. Sato, K. Hashimoto, F. Shigemitsu, and M. Nakase, "New Phase Shifting Mask with Self-Aligned Phase Shifters for a Quarter Micron Photolithography" IEDM Tech. Dig. pp. 57-60, 1989.

[4] I. Hanyu, S. Asai, K. Kosemura, H. Ito, M. Nunokawa and M. Abe, "New Phase-Shifting Mask With Highly Transparent $SiO_2$ Phase Shifters" SPIE Vol. 1264 Optical/Laser Microlithography 111, P. 167-177, 1990.

What is claimed is:

1. A method of forming a phase shifting reticle for semiconductor manufacture comprising:
   depositing an opaque material on a transparent substrate to a thickness of "T";
   forming a first repetitive pattern of openings through the opaque material to the substrate;
   blanket depositing a phase shift material over the opaque material and into the openings;
   polishing and planarizing the phase shift material to an endpoint of the opaque material and to a thickness "T" to form phase shift sections;
   forming a second repetitive pattern of openings through the opaque material to the substrate to form light apertures having opaque light blocker sections on either side, such that an alternating repetitive pattern of light blocker section, light aperture, light blocker section, and phase shift section is formed.

2. The method as recited in claim 1 and wherein: the thickness "T" of the phase shift material and index of refraction of the phase shift material are selected to provide a phase shift of approximately 180°.

3. The method as recited in claim 1 and wherein: planarization of the phase shift material is by chemical mechanical planarization (CMP).

4. The method as recited in claim 1 and wherein: a repetitive pattern of solid lines and openings is formed on the opaque material by a first photolithography process and the openings are filled with a phase shift material.

5. The method as recited in claim 4 and wherein: a repetitive pattern of openings for the light apertures is formed in the solid lines of opaque material by a second photolithography process.

6. A method of forming a phase shifting reticle for use in semiconductor photolithography comprising:
   depositing an opaque material on a transparent substrate to a thickness of "T";
   patterning by a first photolithography process a first repetitive pattern of openings through the opaque material to the substrate with each opening having solid opaque sections on either side;
   blanket depositing a phase shifter material over the solid opaque sections and into the openings with the phase shifter material having a refractive index different than air so that phase shifter sections are formed in openings;
   polishing and planarizing the phase shifter sections by chemical mechanical planarization (CMP) to an endpoint of the opaque material and to a thickness "T" for providing a 180° phase shift;
   patterning by a second photolithography process a second pattern of openings for forming a light apertures in each solid opaque section such that each light aperture has an opaque light blocker section on each side;
   whereby an alternating repetitive pattern of light blocker section, light aperture, light blocker section, and phase shifter section is formed.

7. The method as recited in claim 6 and wherein: the transparent substrate is quartz.

8. The method as recited in claim 7 and wherein: the opaque material is chromium (CR).

9. The method as recited in claim 8 and wherein: the phase shifter material is ($SiO_2$).

10. A method of forming a phase shifting reticle for use in semiconductor photolithography comprising:
    depositing a film of opaque material on a transparent quartz substrate;
    photopatterning and etching the film of opaque material with a first pattern of openings through the opaque material to the substrate by a first photolithography process;
    blanket depositing a phase shifting material into the openings to form phase shifter sections in the openings;
    chemically mechanically planarizing (CMP) the phase shifting material to an endpoint of the opaque material to a thickness "T";
    photopatterning and etching the opaque material with a second set of openings for forming light apertures having light blocker sections on either side;
    whereby a phase shift reticle having a repetitive pattern of light apertures and phase shifter sections separated by light blocker sections is formed, with the thickness "T" and index of refraction of the phase shifting material selected to provide a phase shift difference between light passed through the phase shift sections and through the light apertures of about 180° such that diffracted light is substantially canceled in a dark area therebetween.

11. The method as recited in claim 10 and wherein: the thickness "T" is determined by the formula $$T = \frac{i\lambda}{2(n-1)}$$

where
T = thickness of phase shift material
i = an odd integer
λ = wavelength of exposure light
n = refractive index of phase shifter material at the exposure wavelength.

12. The method as recited in claim 11 and further comprising:
   directing an incident light through the phase shift reticle onto a target wafer in a photolithography process to produce alternating dark areas by diffraction of light waves between a light aperture and an adjacent phase shifter in order to improve the resolution and depth of the photolithography process.

13. The method as recited in claim 11 and wherein:
   the substrate is quartz, the opaque material is chromium (CR), and the phase shifter material is (SiO₂).

14. The method as recited in claim 11 and wherein:
   thickness "T"=3800Å.

15. A method of forming a phase shifting reticle for use in semiconductor photolithography comprising:
   depositing an opaque material on a transport substrate;
   depositing a photosensitive resist onto the opaque material, patterning the resist, and etching a pattern of first openings into the opaque material;
   blanket depositing (SiO₂) as a phase shifter material over the opaque material and into the first openings;
   chemically mechanically planarizing (CMP) the (SiO₂) to the endpoint of the opaque material and to a thickness "T" to produce a phase shift of about 180°;
   depositing a photosensitive resist onto the opaque material patterning the resist and etching a pattern of second openings into the opaque material with opaque light blockers on either side such that a pattern is formed on the substrate including a light blocker section, a light aperture, a light blocker section, and a phase shifter section;
   whereby incident light may be directed through the substrate and light diffracted through a phase shifting section will be canceled by weight diffracted through a light aperture to form a dark area therebetween for improving a resolution of an image on a target wafer to be photopatterned.

16. The method as recited in claim 15 and wherein:
   a 5x reduction lens is placed between the reticle and a water to be photopatterned.

17. The method as recited in claim 16 and wherein:
   the wafer is stepped under the lens to expose the reticle pattern over the entire wafer surface.

18. The method as recited in claim 17 and wherein:
   thickness "T" equals 3800Å.